United States Patent [19]

Eaton, Jr. et al.

[11] Patent Number: 4,893,272
[45] Date of Patent: Jan. 9, 1990

[54] FERROELECTRIC RETENTION METHOD

[75] Inventors: S. Sheffield Eaton, Jr.; Douglas Butler; Michael Parris, all of Colorado Springs, Colo.

[73] Assignee: Ramtron Corporation, Colorado Springs, Colo.

[21] Appl. No.: 184,996

[22] Filed: Apr. 22, 1988

[51] Int. Cl.⁴ .................... G11C 7/00; G11C 11/22
[52] U.S. Cl. .................... 365/145; 365/149; 365/189.06
[58] Field of Search .............. 365/117, 145, 149, 189, 365/189.11, 189.06

[56] References Cited

U.S. PATENT DOCUMENTS

| | | | |
|---|---|---|---|
| 2,938,194 | 5/1960 | Anderson | 365/145 |
| 3,005,976 | 10/1961 | Anderson | 365/145 |
| 3,132,326 | 5/1964 | Crownover | 365/145 |
| 3,354,442 | 11/1967 | Fatuzzo | 365/145 |
| 3,623,031 | 3/1969 | Kumada | 365/145 |
| 3,691,535 | 9/1972 | Williams | 365/145 |

FOREIGN PATENT DOCUMENTS 0278167 8/1988 European Pat. Off. ............ 365/145

Primary Examiner—Stuart N. Hecker
Assistant Examiner—Alyssa H. Bowler
Attorney, Agent, or Firm—Edward D. Manzo

[57] ABSTRACT

Polarization retention of a ferroelectric material in a memory cell is improved by open circuiting the write pulse. The depolarizing field is reduced by allowing charge to dissipate through the ferroelectric material, causing a polarizing field.

6 Claims, 1 Drawing Sheet

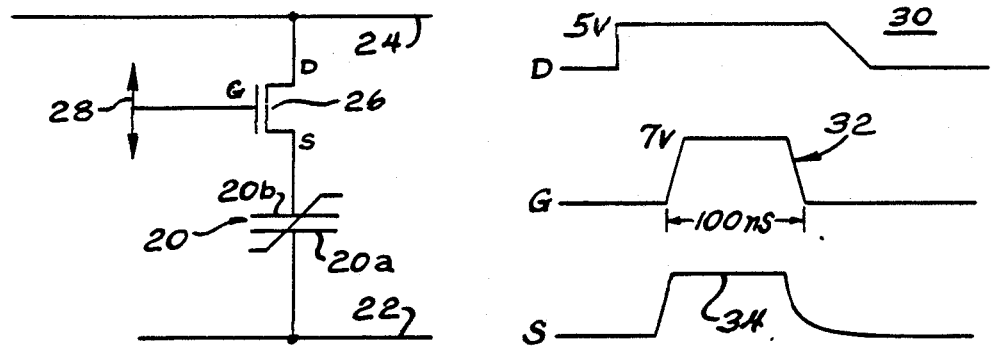
FIG. 1
FIG. 2
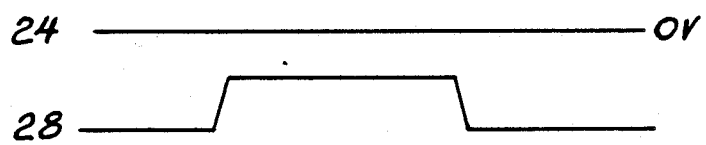
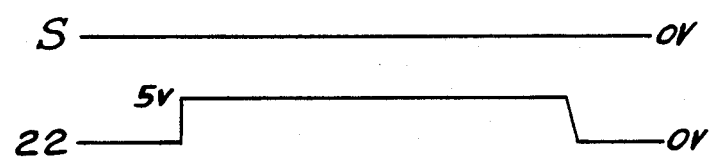
FIG. 3

FERROELECTRIC RETENTION METHOD

FIELD OF THE INVENTION

This invention relates to ferroelectric materials, and particularly to a method to improve the data retention properties of such materials.

BACKGROUND OF THE INVENTION

Ferroelectric materials are dielectrics which can be used in memory circuits. One physical property useful in this regard relates to a hysteresis curve concerning the applied field and the polarization of the ferroelectric material. As described in U.S. Pat. No. 3,728,694, for example, a capacitor can be formed having a ferroelectric material between the electrodes to serve as the dielectric. Because of the hysteresis curve, when an applied voltage is removed, the polarization of the ferroelectric material will be in one of two distinct states. These states can be determined in various fashions, typically by applying a pulse and determining the amount of current passing through the capacitor.

Data retention refers to maintaining the physical phenomenon or property by which binary data is stored, such as ferroelectric polarization, without applied voltage. While ferroelectric materials are useful in non-volatile memory, it is desirable and important that the non-volatile memory be able to maintain the data stored therein for long periods of time, such as years. That is to say, the objective with a ferroelectric, non-volatile memory is to keep the dipoles oriented properly, without changing direction. This has been a problem in using ferroelectric materials. Consequently, an important object of this invention is to provide a way to preserve the polarization of ferroelectric materials after it has been set, without providing further power to the material, i.e. by an applied voltage.

Another problem with ferroelectric materials relates to dipole relaxation. If the material has been in one of its two different polarization states for a relatively long time, one nevertheless wants to be able to change the polarization with a relatively short voltage pulse. For example, if a capacitor using ferroelectric material as dielectric has been in one state for a relatively long time, such as one year, and then a 100 nanosecond pulse is applied to the capacitor plates in such a direction as to change the orientation of the dipoles, then after the pulse is terminated, the dipoles may relax back to the original orientation. Problems of this nature are greater when the ferroelectric material is in a relatively thin film of below about one micron. Therefore, a further object of this invention is to provide a way to overcome the relaxation problem of ferroelectric materials.

SUMMARY OF THE INVENTION

Ferroelectric material is used as a dielectric between two conductive plates, thus forming a ferroelectric capacitor. The capacitor is used to store data by using the polarization state of the ferroelectric material. However, after the commencement of a write pulse applied to a capacitor plate, according to one aspect of the invention, an open circuit condition deliberately is created so that from the perspective of the ferroelectric material, a pulse of long duration is being applied.

Preferably, the ferroelectric capacitor receives its write pulse through the source-drain path of a field effect transistor (FET). Preferably, the gate electrode of the FET is pulsed so that the gate closes before the drain voltage drops to zero. Other methods can be used to leave a charge on one plate of the capacitor so that it will dissipate mainly through the ferroelectric material.

BRIEF DESCRIPTION OF THE DRAWINGS

In describing a preferred embodiment of the present invention, reference is made to accompanying drawings wherein:

FIG. 1 is a schematic diagram useful in explaining the present invention;

FIG. 2 shows waveforms used in FIG. 1; and

FIG. 3 represents further waveforms for FIG. 1.

DETAILED DESCRIPTION OF THE PREFERRED EMBODIMENT

We have found that data retention can be improved in ferroelectric materials by providing uniform polarization throughout the ferroelectric material. Deviations which are relatively small compared to the total thickness appear not to cause a great problem, but when the film becomes increasingly thinner, interface effects can present large problems. Thus, if the material is not homogeneous in polarization for a depth of 200 angstroms at each of the interfaces to the electrodes, then this may present no problem if the total thickness of ferroelectric material is 20 microns, but could present a tremendous difficulty if the thickness is below 1000 angstroms. Thus, data retention appears to be a function of polarization uniformity.

According to the present invention, this condition of improved data retention is brought about by creating an open circuit during the write operation. This causes charge to move through the ferroelectric material thereby tending to stabilize the polarization. The invention can be practiced with a variety of devices, and one circuit is shown in FIG. 1 suitable for such use. Referring to FIG. 1, a ferroelectric capacitor 20 has a plate 20a coupled to a line 22, sometimes called a plate line, which is usually coupled to a reference potential, preferably ground, but which can have non-zero voltage pulses impressed thereon. The other capacitor plate 20b is coupled to a second line 24, which can be called a bit line, via the source-drain path of a field effect transistor (FET) 26. Illustratively FET 26 is an N-channel device, and so the drain electrode D of FET 26 is coupled to second line 24, whereas the source electrode S of the transistor is coupled to the top electrode of capacitor 20. The gate electrode G is coupled to a third line 28 (sometimes called a word line) which is separately controlled. It will be understood that the present invention does not require the use of N-channel FETS. Other switching devices can be used.

Signals for write operations are shown in FIGS. 2 and 3. In FIG. 2, it will be seen that illustratively the voltage on bit line 24 (and thus on drain D) is brought from zero volts to 5 volts for a write pulse 30 of a known duration.

When the method of this invention is used in the FIG. 1 circuit arrangement, at some time a control pulse 32 is applied on line 28 to the gate electrode G to open the gate between the drain and source. As shown in FIG. 2, pulse 32 terminates prior to the trailing edge of pulse 30. It should be noted that this write voltage creates an electric field. When the write voltage is applied in one direction, the ferroelectric material polarizes in one state, and when the opposite voltage is applied, or the field is otherwise reversed, the polarization also changes. Thus, the polarization of the ferroelectric material in the capacitor is the mechanism by which data is stored in a non-volatile fashion. This effect is caused simply by the write voltage or pulse.

But beyond that, in the present invention an open circuit condition is established on the top electrode 20b of ferroelectric capacitor 20. Line 22 is held at zero volts illustratively, as shown in FIG. 2. Capacitor 20 "sees" a 5 volt signal when the gate opens, beginning with the rising edge of pulse 32, but after the gate closes, the 5 volt signal remains at the source electrode S and therefore at the top electrode 20b of capacitor 20. This voltage, represented as signal 34, will dissipate as shown in FIG. 2, moving charge through the ferroelectric material. This charge movement prevents thaw creation of depolarization fields, and dipole relaxation which leads to ultimate loss of data is thereby dissuaded. Preferably the leakage or charge transport through the ferroelectric material exceeds the leakage through the transistor junction. Thus, by requiring the drain voltage to drop later than the gate voltage drops, this effect can be achieved when "writing" into the ferroelectric capacitor in this direction.

Before describing how the ferroelectric is "written" to the opposite direction, a better understanding of the physics should be gained. In particular, it is important to appreciate the existence and manner of controlling the depolarization field in the ferroelectric material. A discussion is now given of the depolarization field and how the open circuit method minimizes or causes the depolarization field not to occur.

Inside a ferroelectric material, the dipoles can be presumed initially (with no applied field) to be oriented in a random state. When a switching voltage is applied across the material, the dipoles align in one direction or the other, depending upon the direction of the voltage applied. For a high enough voltage, virtually all of the dipoles inside the ferroelectric will align in one direction. For a lower voltage, perhaps fewer than all of the dipoles will align, but the majority of them should align in one direction. In order to sense the stored information later, a logic one is defined to mean more dipoles are oriented in on direction than the other, and a logic zero is defined to mean more dipoles are oriented in the opposite direction.

During the presence of a switching voltage, the dipoles are generally aligned in one direction corresponding to the polarity of the voltage, but when the voltage is removed, some of the dipoles normally relax back in the opposite direction. This is due to depolarization fields caused by lack of appropriate compensation charge. When all the dipoles are oriented or aligned in one direction, the polarization is stable only if there is an equal and opposite compensation charge inside the ferroelectric material to offset that value of polarization. When the polarization is switched by a write pulse, that compensation charge moves much more slowly through the ferroelectric material than the speed with which the dipoles can be realigned by the write pulse. Because of this slow movement of compensation charge, if the write pulse is applied to the ferroelectric material for a long enough period, then during that time, the internal compensation charge can move through the ferroelectric film to become again equal and opposite to the intended dipole polarization. Then when the write pulse ends, the ferroelectric material will be stable, with all of the dipoles aligned in the proper direction to indicate the data stored in the capacitor.

But suppose that the write pulse that is applied to the ferroelectric capacitor is very short in duration compared to the amount of time that it takes the compensation charge to move to the position where stability is achieved. The compensation charge is very slow-moving. When the write pulse returns to zero volts, because the compensation charge has not moved adequately, many of those internal dipoles then want to switch back into the previous state. If more than 50% of them switch back, the data is lost.

The reason that the compensation charge is slow-moving is twofold. First, the charge resides in the ferroelectric material, and second, the ferroelectric material typically has a high resistance. It therefore takes a long time, as mentioned, to move this compensation charge completely into that area of the ferroelectric film that needs it.

According to our invention, even if the data being written into the capacitor is opposite to the former data, the depolarization field caused by compensation charge in its former location does not occur. We allow the write pulse voltage (or a portion of it) to decay naturally—through the natural resistance of the ferroelectric material itself. In order to do that, we switch the write voltage onto the plates of the ferroelectric capacitor and then open that switch (FET) so that the write voltage returns to zero only as fast as the ferroelectric material will allow through its own resistance.

It is not necessary to open circuit the entire write voltage. The voltage which must be open circuited to achieve this effect sometimes will be the full supply voltage, but sometimes can be on the order of a few tenths of a volt. The important point is not to bring the write pulse back to zero volts, as in the prior art, but rather to bring it to a voltage sufficient to prevent or minimize the continuance of the depolarization field.

The effect of the open circuiting is to allow a polarizing voltage to remain across the ferroelectric material for a long enough period of time such that the resulting field inside the ferroelectric is a polarizing field, which is in a direction so that none of the dipoles want to relax back to the prior state. The polarizing voltage, in the same direction as the write pulse, applies a polarization field which cancels or negates the depolarization field which results if the write pulse is terminated too quickly.

As the polarizing charge dissipates, the field which moves the compensation charge is also the same field that dissipates the voltage across the ferroelectric, so the rate at which the compensation charge moves is also the same rate at which the voltage dissipates. For this reason, it is preferred to create a good open circuit thereby to guarantee that the rate at which the compensation charge moves, which is essentially due to the resistance of the ferroelectric, is also the same rate at which the write voltage decays. If those rates are equal, then there can be no depolarization field built up and there can be no relaxation of dipoles.

Consequently, it is preferred that the resistance of the ferroelectric material is lower than the resistance on any of the other nodes around the ferroelectric. Typically in an MOS circuit there is a junction. Preferably the leakage of that junction is less than the leakage of the ferroelectric. For example, assume that 5 volts is put across the ferroelectric, and assume also that in order for this invention to work, then 5 volts needs to decay or dissipate itself mostly through the ferroelectric film itself. If there is a lower resistance path somewhere else, for example, in an MOS junction, leakage from that junction may decay the polarizing voltage quicker than the ferroelectric material would.

The ideal situation therefore is to have a perfect open circuit so that the discharge path for those electrons would be only through the ferroelectric film itself. However, one can anticipate that there will be a number of parallel leakage paths around the ferroelectric. Those parallel leakage paths should be of a value that is less than that of the ferroelectric so that most of the charge is dissipated through the ferroelectric, and only a small amount of charge is dissipated through the parallel paths. If the resistance of the parallel paths is low enough, such that the voltage across the ferroelectric decayed to zero very quickly, then that in effect is just like bringing the write pulse to zero very quickly, with no open circuit.

With the present PZT ferroelectric films in current use, there is little problem in this regard. The leakage of MOS junctions is extremely small, and the leakage of the ferroelectric material appears to be comparable to or greater than the MOS junction leakage.

FIG. 3 illustrates waveforms when writing the opposite state into the ferroelectric material than the FIG. 2 drawings represent. Line 22 goes to 5 volts which is coupled to electrode 20a of ferroelectric capacitor 20. Bit line 24 remains at zero volts such that the source S of FET 26 will be at zero volts. This would provide 5 volts in the opposite direction as before across the ferroelectric. One way to open circuit this logic state would be simply to turn off FET 26 prior to changing the potential of bit line 24.

However, in a commercial memory circuit, line 22 would generally be coupled to other similar lines 22. This coupling effectively precludes maintaining a given line 22 at 5 volts. So, another circuit approach can be used to return plate line 22 to zero volts and still have the logic state open circuited. One way in which to achieve this is to put a substrate bias on the chip, such that the source S in FIG. 1 can be driven below ground. If the bit line 24 is at zero volts and the gate G of FET 26 is also at zero volts, then the voltage at the source S can be below ground by one threshold voltage, typically one volt. When plate line 22 drops from 5 volts to zero volts, electrode 20b of the ferroelectric capacitor 20 will drop from zero volts to about minus one threshold voltage or about minus one volt. That voltage is still in a polarizing direction, and should be permitted to dissipate mainly through the ferroelectric material.

Another approach uses two ferroelectric capacitors per memory cell, as described with respect to FIG. 4 in the co-pending U.S. Ser. No. 013,746 of S. Eaton, Jr. entitled "Self-Restoring Ferroelectric Memory," filed Feb. 12, 1987 (RAM 302) now U.S. Pat. No. 4,873,664 and hereby incorporated by reference thereto. In that case we need to open circuit only one logic state because with two complementary ferroelectric capacitors per bit, one or the other of those capacitors will always be written in a condition which can be open circuited in the manner first described above, i.e. where 5 volts is coupled to the top plate of the capacitor 20, and then line 22 is grounded. One of the two capacitors in this alternate embodiment would always have that condition, and one of those two capacitors could always be open circuited effectively.

It will be appreciated that modifications within the scope of this invention, defined by the claims, can be made, and that this description is to be taken as illustrative.

We claim:

1. A method of operating a ferroelectric capacitor having first and second electrodes with a ferroelectric dielectric therebetween to improve data retention therein comprising the steps of:

generating a write pulse;

coupling said write pulse to said first electrode of said capacitor via a switching device coupled to said first electrode; then disconnecting the write pulse from said first electrode by opening said switching device prior to terminating said write pulse, and then terminating said write pulse, whereby dipoles in said ferroelectric dielectric are maintained in an aligned position.

2. A method of improving data retention in a ferroelectric material where remanent polarization retains the data, wherein said ferroelectric material is positioned between first and second electrodes of a ferroelectric capacitor, comprising the steps of:

applying a write voltage across the ferroelectric material, including generating a write pulse having said write voltage, coupling said write pulse to said first electrode of said ferroelectric capacitor via a switching device coupled to said first electrode, said second electrode being coupled to ground; and allowing at least a portion of the write voltage to decay through the ferroelectric material, including disconnecting said write pulse from said first electrode by opening said switching device prior to terminating said write pulse so that while said write voltage is applied across the ferroelectric material, dipoles within the ferroelectric material becomes aligned in a predetermined manner with respect to said first and second electrodes, and so that after said switching device is opened, said dipoles within the ferroelectric material tend to remain aligned while said voltage decays through the ferroelectric material, whereby the dipole orientation which represents the data is improved as to its retention time.

3. A method of improving data retention in a ferroelectric material where remanent polarization retains the data, comprising the steps of:

applying a write voltage across the ferroelectric material, including coupling said write voltage to one electrode of a capacitor, said ferroelectric material being located in said capacitor, and allowing at least a portion of the write voltage to decay through the ferroelectric material, said allowing step comprising controlling said coupling to disconnect said electrode from said write voltage to leave at least a portion of said write voltage on said electrode, the method further including dropping said write voltage to ground after said disconnecting step.

4. A method of improving data retention in a ferroelectric capacitor having two electrodes comprising the steps of impressing a write voltage across said electrodes; then maintaining a polarizing voltage across said electrodes which decays in a time similar to the time allowed by the resistance of the ferroelectric material itself, wherein said maintaining step comprises isolating one of said electrodes by opening a switch coupled thereto prior to a time when said write voltage drops to zero volts, and thereafter dropping said write voltage to zero volts.

5. A method of operating a ferroelectric capacitor having first and second electrodes and a ferroelectric material therebetween, said ferroelectric material including dipoles, the method improving data retention represented by the orientation of said dipoles and comprising the steps of:
coupling said first electrode of said capacitor to a voltage source via a switching device;
coupling said second electrode to ground;
generating a write pulse at said voltage source and coupling said write pulse via said switching device to said first electrode while said second electrode is coupled to ground;
opening said switching device prior to a time when said write pulse terminates so that voltage initially remains on said first electrode and decays to ground through said ferroelectric material; and
terminating said write voltage after said opening step.

6. The method according to claim 5 wherein said switching device comprises a transistor having a control electrode and operating selectively to apply high or low impedances along a path in response to voltage applies to said control electrode, said path coupling said first electrode to said voltage source, and wherein said opening step comprises operating said transistor to interpose a high impedance between said first electrode and said voltage source.

* * * * *